US009091724B2

(12) United States Patent
Ortler et al.

(10) Patent No.: US 9,091,724 B2
(45) Date of Patent: Jul. 28, 2015

(54) SYNTHESIZER HAVING ADJUSTABLE, STABLE AND REPRODUCIBLE PHASE AND FREQUENCY

(75) Inventors: Georg Ortler, Gessertshausen (DE); Christian Evers, Kirchheim (DE); Markus Freidhof, Kirchseeon (DE)

(73) Assignee: Rohde & Schwarz GmbH & Co. KG, Munich (DE)

( * ) Notice: Subject to any disclaimer, the term of this patent is extended or adjusted under 35 U.S.C. 154(b) by 995 days.

(21) Appl. No.: 13/254,873

(22) PCT Filed: Feb. 10, 2010

(86) PCT No.: PCT/EP2010/000809
§ 371 (c)(1),
(2), (4) Date: Jan. 17, 2012

(87) PCT Pub. No.: WO2010/099855
PCT Pub. Date: Sep. 10, 2010

(65) Prior Publication Data
US 2012/0105049 A1    May 3, 2012

(30) Foreign Application Priority Data
Mar. 5, 2009   (DE) .......................... 10 2009 011 795

(51) Int. Cl.
G01R 23/02    (2006.01)
H03L 7/00     (2006.01)
G01R 31/28    (2006.01)
H03L 7/18     (2006.01)
(Continued)

(52) U.S. Cl.
CPC .............. *G01R 31/2841* (2013.01); *H03L 7/18* (2013.01); *H03L 7/23* (2013.01); *G01R 27/28* (2013.01)

(58) Field of Classification Search
CPC .... G01R 27/28; G01R 31/2841; G01R 23/02; H03L 7/16; H03L 7/18
USPC ............................................ 324/76.11, 76.39
See application file for complete search history.

(56) References Cited

U.S. PATENT DOCUMENTS

| 4,933,890 | A | 6/1990 | Nuytkens et al. |
| 5,111,163 | A | 5/1992 | Erlich |
| 5,291,428 | A * | 3/1994 | Twitchell et al. ................. 708/3 |
| 5,467,294 | A | 11/1995 | Hu et al. |
| 5,519,343 | A | 5/1996 | Britz |
| 6,163,223 | A | 12/2000 | Kapetanic et al. |
| 6,970,000 | B2 | 11/2005 | Evers et al. |
| 2006/0014515 | A1 | 1/2006 | Ruelke et al. |

(Continued)

FOREIGN PATENT DOCUMENTS

| DE | 199 40 896 A1 | 3/2001 |
| DE | 697 12 092 T2 | 10/2002 |

(Continued)

OTHER PUBLICATIONS

International Search Report, PCT/EP2010/000809, Aug. 20, 2010, pp. 37-42.

(Continued)

*Primary Examiner* — Amy He
(74) *Attorney, Agent, or Firm* — Ditthavong & Steiner, P.C.

(57) ABSTRACT

A measuring device provides a synthesizer device, at least two controlling devices and at least two controlled oscillators. The synthesizer device contains at least one direct digital synthesizer and generates at least two signals of known phase ratio. Signals generated by the synthesizer device form reference signals of at least one controlling device. Signals formed by the controlling devices control the controlled oscillators. The measuring device contains only frequency splitters, which divide by integer division factors.

20 Claims, 5 Drawing Sheets

(51) Int. Cl.
*H03L 7/23* (2006.01)
*G01R 27/28* (2006.01)

(56) References Cited

U.S. PATENT DOCUMENTS

| | | |
|---|---|---|
| 2007/0040615 A1 | 2/2007 | Ammar |
| 2007/0189361 A1 | 8/2007 | Sugiyama et al. |
| 2007/0236230 A1 | 10/2007 | Tanbakuchi et al. |
| 2008/0204041 A1 | 8/2008 | Anderson et al. |
| 2008/0258833 A1 | 10/2008 | Richt et al. |
| 2009/0121796 A1 | 5/2009 | Patterson |

FOREIGN PATENT DOCUMENTS

| | | |
|---|---|---|
| DE | 102 46 700 A1 | 4/2004 |
| DE | 10 2005 049 578 A1 | 4/2007 |
| DE | 10 2006 003 839 A1 | 7/2007 |
| DE | 697 37 801 T2 | 3/2008 |
| DE | 102 53 719 B4 | 4/2008 |
| WO | 98/28852 A2 | 7/1998 |
| WO | WO 02/25807 A2 | 3/2002 |
| WO | WO 2007/045388 A1 | 4/2007 |
| WO | WO 2007/124788 A1 | 11/2007 |
| WO | WO 2008/127972 A1 | 10/2008 |

OTHER PUBLICATIONS

Saul et al., "A High-Speed Direct Frequency Synthesizer," Feb. 1, 1990, IEEE Journal of Solid-State Circuits, IEEE Service Center, Piscataway, NJ, US.

International Preliminary Report on Patentability for PCT Application No. PCT/EP2010/000809 dated Sep. 15, 2011, pp. 1-19.

\* cited by examiner

SYNTHESIZER HAVING ADJUSTABLE, STABLE AND REPRODUCIBLE PHASE AND FREQUENCY

CROSS-REFERENCE TO RELATED APPLICATION

The present application is a national phase application of PCT Application No. PCT/EP2010/000809, filed on Feb. 10, 2010, and claims priority to German Patent Application No. DE 10 2009 011 795.4, filed on Mar. 5, 2009, the entire contents of which are herein incorporated by reference.

BACKGROUND OF THE INVENTION

1. Field of the Invention

The invention relates to a measuring device with signal generators with adjustable, stable and reproducible phases and frequencies and a method for the operation of a measuring device for generating signals with adjustable, stable and reproducible phases and frequencies.

2. Discussion of the Background

In metrology, for example, in network-analysis metrology, a high-frequency signal is used to supply the device under test. A further high-frequency signal is used as a local oscillator signal in order to mix the received generator signals into an appropriate intermediate frequency position. If a complex wave value, such as the wave reflected at the input of the device under test, is to be determined according to magnitude and phase via the frequency, the frequency and phase ratios of both high-frequency signals after each frequency step of the incrementally processed measurement-frequency range must be known. Otherwise only a ratio measurement, in which the absolute phase is irrelevant, can be carried out.

The problem becomes particularly significant if a plurality of signal generators is involved, for example, in the case of differential multi-port measurements, or complex conversion measurements on frequency-converting devices under test, for example, mixers. Several signals of different frequencies are then necessary. These are usually generated by means of independent signal generators. However, an exact frequency ratio and an exact phase ratio are then no longer provided.

One possibility for implementing complex conversion measurements is described by the "Secum-Trahenz Method" in the German published patent application DE 10 2006 003 839 A1.

According to this method, the signal generators and local oscillators are generated starting from one common reference signal. The reference signal is divided by fractional splitters. In this manner, any desired frequencies of the reference signal can be generated. However, the phase relationship is lost via the fractional splitting. The phase relationship is only restored via a phase correction. However, this is very slow and requires a large volume of software. Furthermore, a new correction of the phases of the signals is required after every change in frequency. This results in a slow measurement speed.

SUMMARY OF THE INVENTION

Embodiments of the present invention provide a measuring device and a method of operation of a measuring device which allow an exact adjustment of the frequencies and the phase relationship of at least two high-frequency signals with a fast measurement speed.

The measuring device according to embodiments of the invention provides a synthesizer device, at least two controlling devices and at least two controlled oscillators. The synthesizer device contains at least one direct digital synthesizer and generates at least two signals of known phase ratio. Signals generated by the synthesizer device form reference signals of at least one controlling device. Signals formed by the controlling devices control the controlled oscillators. The measuring device contains only frequency splitters, which divide by integer division factors. In this manner, a known phase ratio of the output signals is reliably achieved.

The synthesizer device preferably contains precisely one direct digital synthesizer and preferably generates at least two signals of identical frequency. In this manner, two signals of identical frequency but different phase position can be generated with minimum cost, as required for differential signal pairs with 180° phase difference.

As an alternative, the synthesizer device contains several direct digital synthesizers and generates several signals of adjustable frequency. In this manner, a high degree of flexibility is achieved and various signals can be generated for frequency-converting devices under test, for example, an input signal and the oscillator signal for a mixer as a device under test.

The measuring device advantageously contains at least two frequency splitting devices. Each frequency splitting device processes signals preferably generated by a controlled oscillator. In this manner, an especially high degree of flexibility of the generated signals can be achieved.

Each frequency splitting device preferably contains several frequency paths for signals of different frequency ranges. Each frequency path preferably contains one switching device, which connects the frequency path to a signal output. At the same time, preferably precisely one frequency path is connected via the switching device to a signal output. In this manner, a signal of a single frequency can be selected in a reliable manner.

At least one frequency path preferably contains a filter. At least one frequency path preferably contains at least one frequency splitter, which divides by integer division factors. In this manner, a selection of the signals can be made at low cost.

A mixer is advantageously arranged within a frequency path. The mixer in the frequency path preferably mixes the signal of the frequency path down with a clock frequency or a multiple of a clock frequency. In this manner, accurate output signals can be achieved at low cost, especially for low frequencies.

The controlling devices advantageously each contain a phase discriminator, a loop controller, and at least one frequency splitter which divides by integer division factors. The frequency splitter preferably divides the frequency of a signal generated by a controlled oscillator. The frequency splitter preferably transmits the signal it has generated to the phase discriminator. In this manner, a very high degree of stability of the generated signal within a PLL (Phase Locked Loop) is achieved.

By preference, at least one mixer is arranged between the synthesizer device and the controlled oscillator. The mixer preferably mixes at least one signal generated by the synthesizer device with a clock signal or a multiple of a clock signal. In this manner, demands on the controlling device are reduced.

The synthesizer device preferably generates digital signals with a high degree of accuracy. At least one analog-digital converter is advantageously arranged between the synthesizer device and the controlled oscillator. The analog-digital converter preferably converts at least one signal generated by the synthesizer device into at least one analog signal. The analog-digital converter typically provides a lower quantisation precision than the synthesizer device. At least one dithering device is therefore preferably connected downstream of the synthesizer device. The dithering device implements a dithering at least of the signal generated by the synthesizer device. In this manner, a very precise adjustment of the frequency and phase of the output signal is possible.

BRIEF DESCRIPTION OF THE DRAWINGS

The invention is described by way of example below on the basis of the drawings, in which an advantageous exemplary embodiment is presented. The drawings are as follows.

DETAILED DESCRIPTION OF EXEMPLARY EMBODIMENTS OF THE INVENTION

The problem underlying the present invention is first explained with reference to FIG. 1. The structure and method of operation of various exemplary embodiments of the measuring device according to the invention are then shown with reference to FIGS. 2-4. Finally, the operation of an exemplary embodiment of the method according to the invention is shown with reference to FIG. 5.

The presentation and description of identical elements in similar drawings has not been repeated in some cases.

Figure 1:
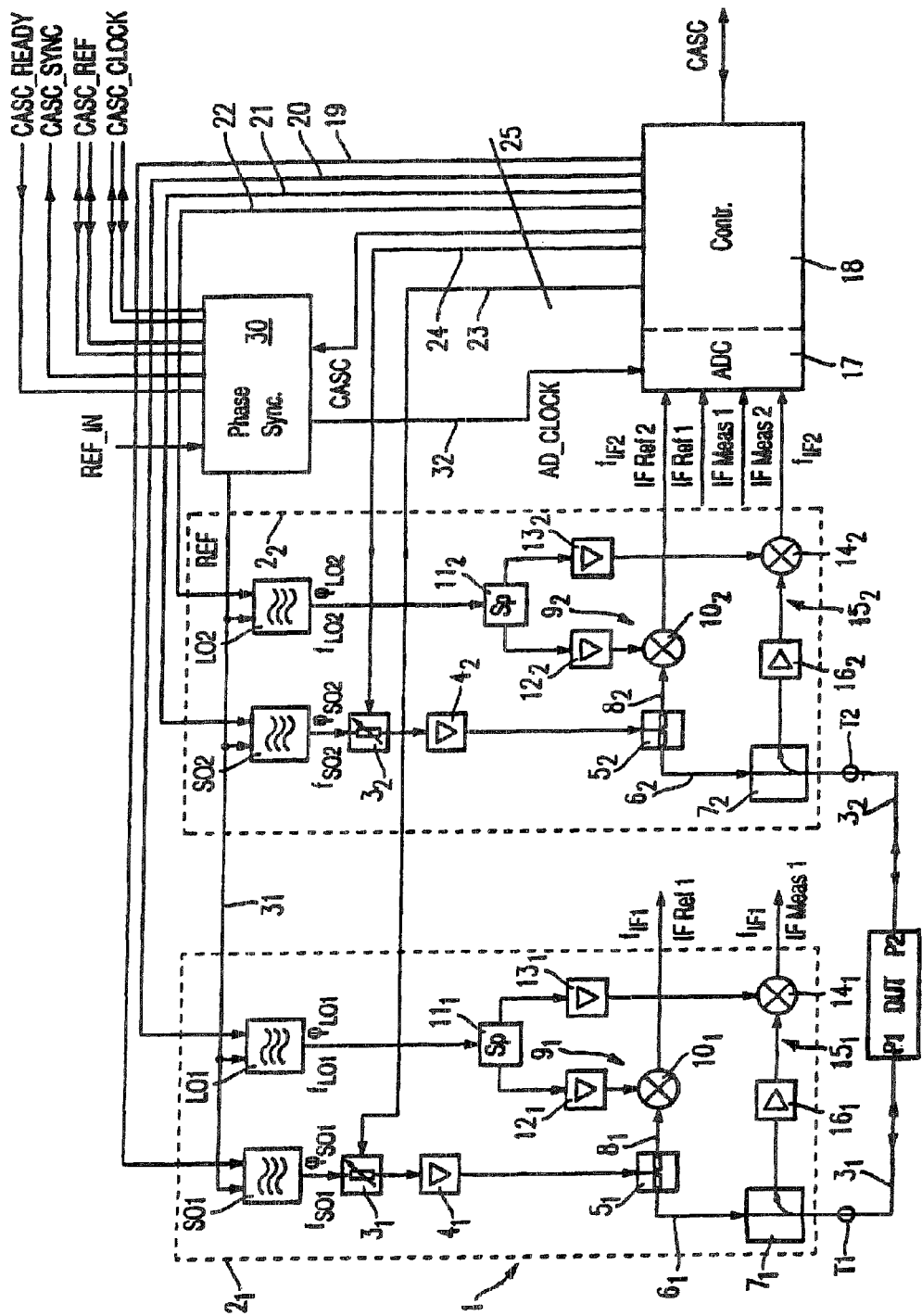
FIG. 1 shows an example of a measuring device.

FIG. 1 shows an example of a measuring device. This is a 2-port vectorial network analyzer.

In the illustrated network analyzer, a separate excitation/reception unit $2_1$ or respectively $2_2$ is present at each port T1, T2 of the network analyzer. Each excitation/reception unit $2_1$ or respectively $2_2$ provides a signal generator SO1 or respectively SO2, with which the device under test DUT can be supplied with an excitation signal. Either only one of the two signal generators SO1 or SO2 may be active, or both of the signal generators SO1 and SO2 can transmit an excitation signal.

The DUT provides at least two ports P1 and P2. Both ports P1 and P2 of the device under test DUT are connected via a measuring line $3_1$ or respectively $3_2$ to one of the two ports T1 or respectively T2 of the network analyzer.

The signal generators SO1 and SO2 are each connected to a signal splitter (signal splitter) $5_1$ or respectively $5_2$ via a variable attenuator $3_1$ or respectively $3_2$ and in each case an amplifier $4_1$ or respectively $4_2$. A signal branch $6_1$ or respectively $6_2$ is connected via a bridge (for example, a directional coupler) $7_1$ or respectively $7_2$ to the allocated port T1 or T2 respectively. The other branch $8_1$ or respectively $8_2$ is connected to a mixer $10_1$ or respectively $10_2$ of a first reception device $9_1$ or respectively $9_2$ of the respective excitation/reception unit $2_1$ or respectively $2_2$. The first reception device $9_2$ or respectively $9_2$ therefore receives the excitation signal, when the associated signal generator SO1 or respectively SO2 is active. Furthermore, an oscillator signal is supplied to the mixer $10_1$ or respectively $10_2$, which is generated by an internal oscillator LO1 or respectively LO2 of the respective excitation/reception unit $2_1$ or respectively $2_2$, and supplied to the mixer $10_1$ or respectively $10_2$ via a signal splitter $11_1$ or respectively $11_2$ or respectively an amplifier $12_1$ or respectively $12_2$.

Via the other signal path of the signal splitters $11_1$ or respectively $11_2$ and a corresponding amplifier $13_1$ or respectively $13_2$, the same oscillator LO1 or respectively LO2 supplies a mixer $14_1$ or respectively $14_2$ of a second receiving device $15_1$ or respectively $15_2$ of the respective excitation/receiving unit $2_1$ or respectively $2_2$. The mixer $14_1$ or respectively $14_2$ is connected, via an isolating amplifier $16_1$ or respectively $16_2$ and the bridge $7_1$ or respectively $7_2$, to the associated gate T1 or respectively T2. In this manner, the second receiving device $15_1$ obtains the signal received from the corresponding gate $T_1$, reflected from the device under test to the gate T1 or transmitted via the device under test DUT from the gate T1 to the gate T2. Correspondingly, the second receiving device $15_2$ of the excitation/receiving unit $2_2$ obtains the signal reflected from the device under test DUT to the gate T2 or transmitted via the device under test DUT from the gate T1 to the gate T2. The mixers $10_1$ and $14_1$ of the first excitation/receiving unit $2_1$ convert the signal received into a first intermediate frequency position with the intermediate frequency $f_{IF1}$, while the mixers $10_2$ and $14_2$ of the second excitation/receiving unit $2_2$ the convert the signal received into a second intermediate frequency position with the intermediate frequency $f_{IF2}$. In this case, the intermediate frequencies $f_{IF1}$ and $f_{IF2}$ are not necessarily identical.

The intermediate frequency reference signal IF Ref 1 or respectively IF Ref 2 generated by the mixers $10_1$ or respectively $10_2$ as well as the intermediate frequency measuring signal IF Meas 1 or respectively IF Meas 2 generated by the mixers $14_2$ or respectively $14_2$ is connected to an analog/digital converter 17, which is connected to a signal evaluation and control unit 18. This implements an evaluation of the reference signals and the measuring signals. Furthermore, the signal evaluation and control unit 18 controls the signal generators SO1 and SO2 as well as the oscillators LO1 and LO2 via control lines 19, 20, 21 and 22 in such a manner that these generate a signal with predetermined frequency $f_{SO1}$, $f_{LO1}$, $F_{SO2}$ or $f_{LO2}$ and with predetermined phase $\phi_{SO1}$, $\phi_{LO1}$, $\phi_{SO2}$ and $\phi_{LO2}$.

Via further control lines 23 and 24, the evaluation and control unit 18 is connected to the adjustable attenuators $3_1$ and $3_2$, so that the signal amplitude of the excitation signal generated by the signal generators S01 and S02 is controllable. Because the actual amplitudes of the excitation signals are registered via the intermediate frequency reference signals IF Ref 1 and IF Ref 2, a control loop for the exact control of the excitation amplitude can be formed in this way.

The control lines 19 to 23 can be combined to form a bus system 25, especially a LAN bus system. Through differential adjustment of the phases $\phi_{LO1}$, $\phi_{LO2}$ or $\phi_{SO1}$, $\phi_{SO2}$, run-time differences, for example in the measuring lines $3_1$ and $3_2$, can be compensated.

The network analyzer presented has a phase-synchronizing unit 30 which receives the signals CASC_READY, CASC_SYNC, CASC_REF and CASC_CLOCK from other network analyzers or transmits them to the latter. In the control unit 18, it is established whether the corresponding network analyzer is superordinate (Master) or subordinate (Slave). For example, the operator can enter in the respective network analyzer that this network analyzer is to be the superordinate master device (Master). This network analyzer then transmits the signal CASC to the other network analyzers, which then know that they are the subordinate network analyzers (Slaves)

in the pending measuring task. The signal CASC is also transmitted to the phase-synchronizing unit 30.

Via a connecting line 31, the phase-synchronizing unit 30 is connected to the signal generators S01 and S02 as well as to the local oscillators L01 and L02 and specifies a main reference signal REF for them. The phase-synchronizing unit 30 is connected via a connecting line 32 to the analog-digital converter 17 and transmits the clock signal AD_CLOCK to the latter to determine the sampling time. The auxiliary reference signal REF_IN required for the generation of the main reference signal REF can either be supplied externally or generated inside the network analyzers.

The phase-synchronizing unit 30 thus generates the main reference signal REF. If the measuring device is currently the master, it is regulated by means of an additional auxiliary reference signal REF_IN in such a manner that it provides a stable frequency and phase. If the measuring device is currently a slave, the main reference signal REF is adjusted to a reference signal transmitted by the master.

The oscillators S01, S02, L01, L02 thus use an identical reference to generate their output signals.

If the individual oscillators S01, S02, L01, L02 generated signals of random frequencies by means of fractional splitters, the phase relationship of the signals would, however, be lost as a result because fractional splitters do not generate a reliably traceable phase of the signal. The present invention serves to solve this problem on the basis of a suitable concept for frequency conditioning.

Figure 2:
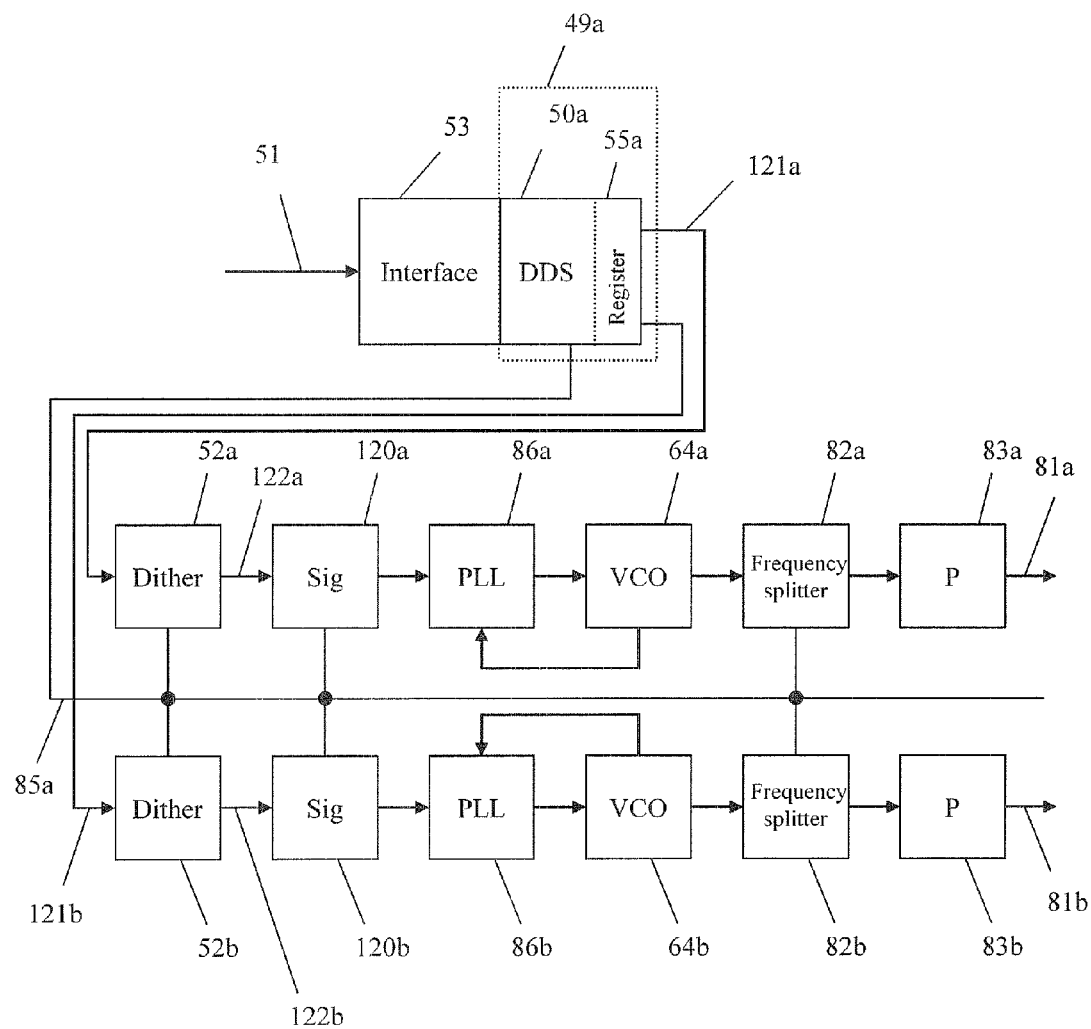
FIG. 2 shows a first exemplary embodiment of a block-circuit diagram of the measuring device according to the invention.

In FIG. 2, a first exemplary embodiment of the measuring device according to the invention is presented. The signal generating unit of the measuring device is illustrated here. A synthesizer device 49a contains a direct digital synthesizer (direct digital signal generator) 50a. This is controlled by an interface 53. The interface is connected to a control input 51. The direct digital synthesizer 50a provides a register 55a, an adding device and a phase table. In the register 55a a bit sequence is stored for every timing point. The register 55a, forms a phase accumulator. With every clock pulse, the value present at the control input 51 is added via the adding device to the value in the register 55a. Accordingly, the value stored in the register 55a is processed by the phase table to form an output value of the direct digital synthesizer. This occurs in each case by reading out from the phase table one of the values corresponding to the register value.

The signal generation with a direct digital synthesizer (direct digital synthesiz, DDS) operates on the basis that a plurality of phase values of the wave form to be generated are stored in the register 55a of the phase accumulator. The wave form to be generated is preferably a sine wave. The corresponding amplitude values at a plurality of different positions in the cycle of the sine oscillation are recorded in the phase accumulator. Through the reading of these values with a specified clock speed, a digital sequence of amplitude values can be generated which correspond to the signal characteristic. Dependent on the clock rate of the reading, a different frequency of the wave form is obtained after the digital-analog converter. By varying the position at which the reading of the amplitude values from the phase accumulator is initiated, the phase of the wave form can be altered.

The register 55a provides a wide breadth of preferably at least 30 bit, but by particular preference of 48 bit. This results in a very high frequency resolution of the signals generated by the direct digital synthesizer. Several signals of identical frequency but different phase can be generated through many tappings of the phase accumulator. The phases of the signals can thus be adjusted by specifying the tappings. For example, for push-pull measurements, signals of exactly identical frequency but with phase shifted by 180° can be generated. The direct digital synthesizer 50a is accordingly connected to a clock line 85a. With every clock pulse the direct digital synthesizer 50a generates a digital initial value for each tapping. The clock frequency in this exemplary embodiment is 384 MHz. In this exemplary embodiment, the direct digital synthesizer 50a provides 2 tappings. Two output signals are thus output on the lines 121a and 121b.

The signals are transmitted to the dithering devices 52a, 52b. A dithering of the signals is implemented. This leads to an error scattering and removes quantisation noise, which is generated by the subsequent digital-analog converter. This measure further contributes to the phase noise formation, which achieves an improvement of the phase noise close to the carrier. A dithering is understood to mean a superimposition of the high-precision output signal of the direct digital synthesizer with a high-frequency, low-amplitude white noise. The dithering devices 52a, 52b are also connected to the clock line 85a.

Because of the digital processing, the frequencies and phases of the various signals are known exactly. The direct digital synthesizer 50a, the interface 53a and the dithering devices 52a, 52b are optionally realised on an FPGA. This simplifies the development and reduces the manufacturing costs with small production numbers.

From the dithering devices 52a, 52b, the signals are fed to signal-conditioning devices 120a, 120b. The signal-conditioning devices 120a, 120b convert the digital signals of the dithering devices 52a, 52b into analog signals and mix the signals with the clock signal to transform them into a different frequency range. The precise function of the signal-conditioning devices 120a, 120b is described in further detail with reference to FIG. 4.

The signal-conditioning devices 120a, 120b are connected to controlling devices 86a, 86b. The controlling devices 86a, 86b are connected to controlled oscillators 64a, 64b. The output signals of the frequency conditioning devices 120a, 120b are used as reference signals of the controlling devices 86a, 86b. The controlling device 86a, 86b of the phase-locked loop (phase locked loop PLL) controls the output signals of the controlled oscillators 64a, 64b very precisely in their frequency and phase. The output signals of the controlled oscillators 64a, 64b are thus in a fixed frequency ratio and in a fixed phase ratio with the respective output signals of the frequency conditioning devices 120a, 120b. The function of the controlling devices 86a, 86b, especially the frequency increase from their input signal to the output signal of the controlled oscillators 64a, 64b is accordingly optionally controlled by the interface 53.

The controlled oscillators 64a, 64b provide a frequency range of 6-12 GHz. In order to generate frequencies below this range, their output signals are fed to frequency-splitting devices 82a, 82b. The frequency-splitting devices 82a, 82b divide the frequencies of the input signals and thus generate signals with random frequencies from 0-12 GHz. This is described in greater detail with reference to FIG. 4. The frequency-splitting devices 82a, 82b are also supplied with the clock signal.

The relayed signals are matched in their levels in level-matching devices 83a, 83b and output via the outputs 81a, 81b. This is also described in greater detail with reference to FIG. 4.

To ensure that the fixed phase ratios of the direct digital synthesizer are not lost in the output signal of the signal generators, no components which could cause an unpredictable phase jump are used during the entire signal processing. Accordingly, no switchable oscillators or non-integer splitters are present.

Figure 3:
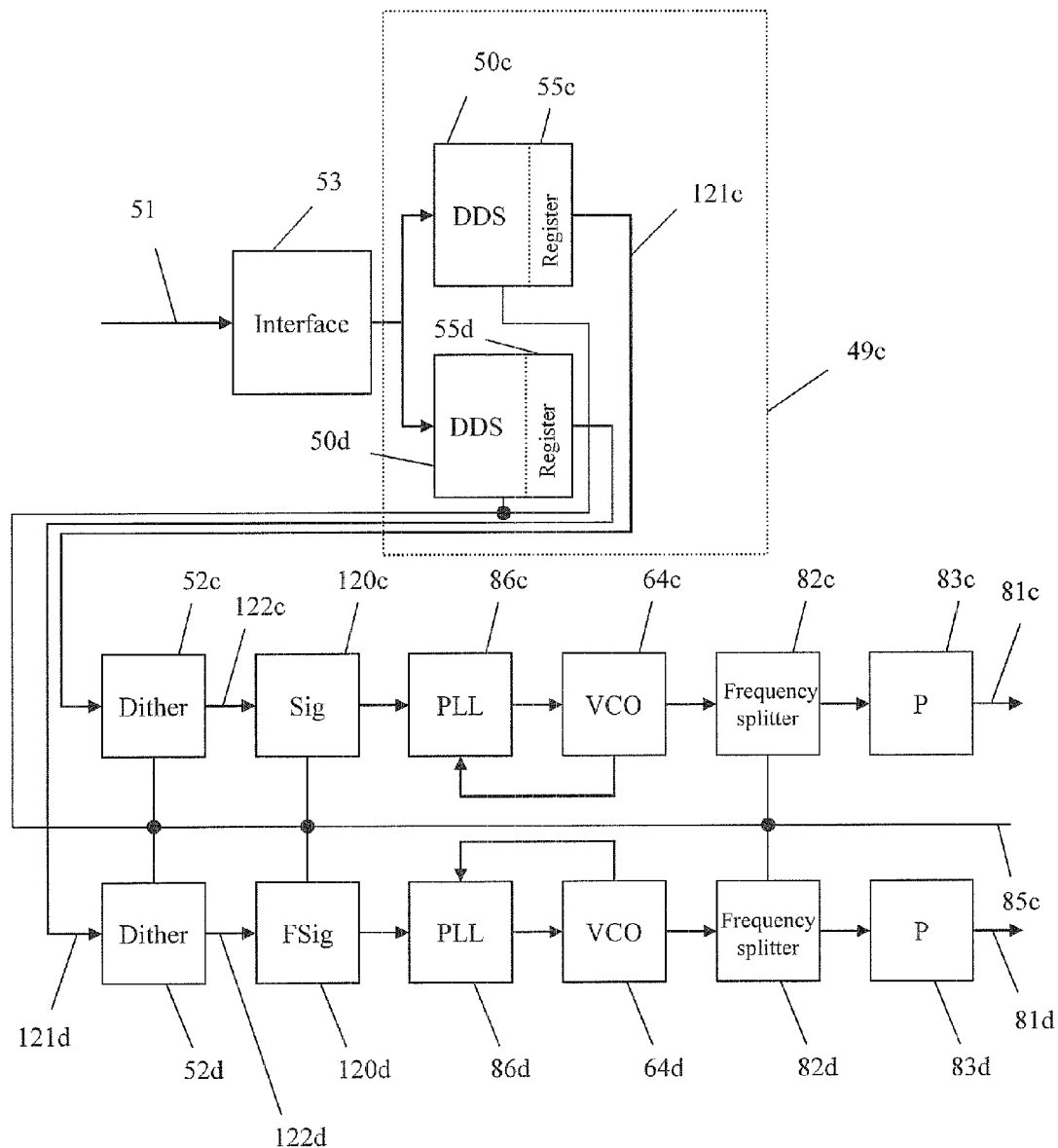
FIG. 3 shows a second exemplary embodiment of a block-circuit diagram of the measuring device according to the invention.

In FIG. 3 a second exemplary embodiment of the measuring device according to the invention is presented. The second exemplary embodiment accordingly corresponds to a large degree with the first exemplary embodiment. The synthesizer device 49c here contains two separate direct digital synthesizers 50c, 50d with separate registers 55c, 55d. These are supplied with a clock signal by the same clock line 85c and operate synchronously with it. An adjustment of independent frequencies and phases is therefore still possible. For example, for complex frequency-converting measurements, signals of various frequencies and phases but with a known phase ratio can be generated.

Furthermore, the structure in FIG. 3 corresponds to the structure in FIG. 2. The lines 121c, 121d correspond to the lines 121a, 121b. The dithering devices 52c, 52d correspond to the dithering devices 52a, 52b. The lines 122c, 122d correspond to the lines 122a, 122b. The signal processing devices 120c, 120d correspond to the signal processing devices 120a, 120b. The controlling devices 86c, 86d correspond to the controlling devices 86a, 86b. The controlled oscillators 64c, 64d correspond to the controlled oscillators 64a, 64b. The frequency splitting devices 82c, 82d correspond to the frequency splitting devices 82a, 82b. The level-matching devices 83c, 83d correspond to the level-matching devices 83a, 83b.

Figure 4:
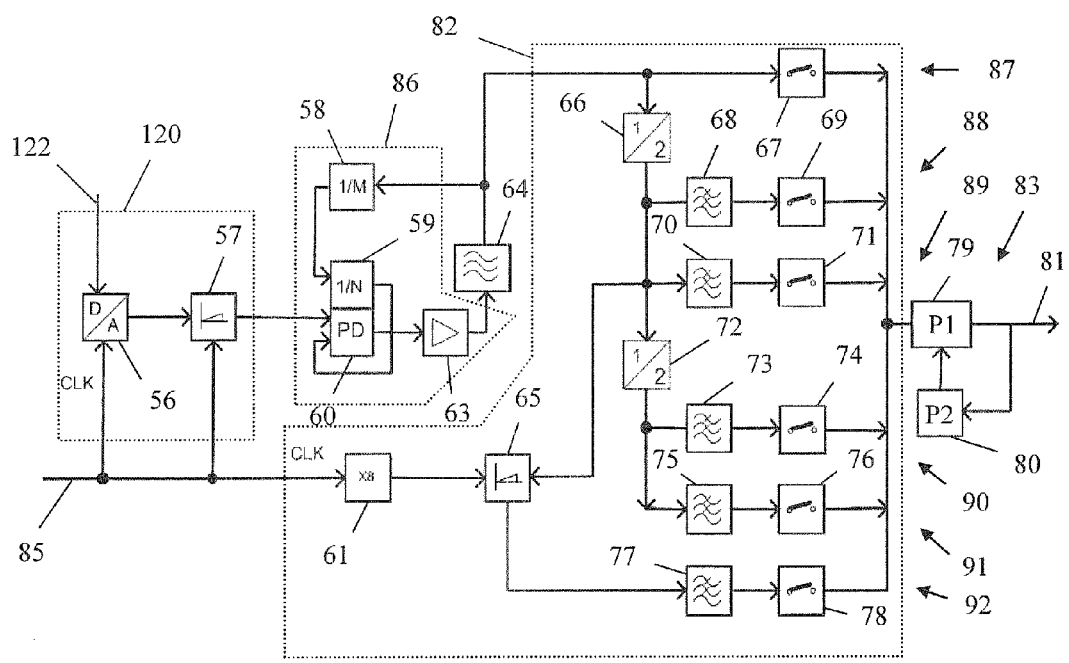
FIG. 4 shows a detailed view of the first and second exemplary embodiments of the measuring device according to the invention.

FIG. 4 shows a detailed view of the first and second exemplary embodiments of the measuring device according to the invention. A signal processing branch is shown, which is connected downstream of a single signal output of a direct digital synthesizer 50a, 50c, 50d. This structure is identical for all lines 122a, 122b, 122c, 122d of FIG. 2 and FIG. 3. The digital output signal of the dithering device is supplied to the digital-analog converter 56. The analog output signal of the digital-analog converter 56 is supplied to the mixer 57. The latter mixes it with the clock signal, which is supplied to it via the clock line 85. A mixing up or a mixing down can be used. In this exemplary embodiment a mixing up is used. This means that the resulting signal provides a frequency, which corresponds to the sum of the frequency of the clock signal and the frequency of the signal of the respective direct digital synthesizer. With an exemplary clock frequency of 384 MHz and an exemplary, possible frequency of the signal of the direct digital synthesizer of 40 MHz-100 MHz, a signal frequency of 424-484 MHz after the mixer 57 is obtained.

The output signal of the mixer 57 is supplied to the controlling device 86. The controlling device 86 contains at least one integer frequency splitter 58, 59. In this exemplary embodiment, two series connected integer frequency splitters 58, 59 are used. Furthermore, the controlling device 86 contains a phase discriminator 60 and a loop controller 63. The analog signal, which was generated from the mixer 57, is supplied to the phase discriminator 60. This compares the phases of the analog signal and of a feed-back signal. The phase discriminator 60 produces a digital signal as an output signal, which provides a forward or return phase. The loop controller 63 implements a low-pass filtering and conversion of the digital signal of the phase discriminator 60 and controls the voltage-controlled oscillator 64 with a suitable control signal.

The voltage-controlled oscillator 64 generates a high-frequency signal. The frequency of the high-frequency signal is divided by the integer splitters 58, 59 and fed back to the phase discriminator 60 as a control variable. The precise frequency of the signal generated by the voltage-controlled oscillator 64 can therefore be adjusted via the frequency of the signal output from the direct digital synthesizer and the division factors of the splitter 58, 59. Due to a limited bandwidth of the oscillator 64, only output signals within a certain bandwidth are possible. The oscillator 64 used in this exemplary embodiment provides a bandwidth of 6-12 GHz.

The frequency splitting device 82 contains several signal paths and frequency paths 87-92. The signal paths 87-92 are used for the processing of signals of different frequencies. Every signal path 87-92 contains a switch 67, 69, 71, 74, 76, 78. The switches 67, 69, 71, 74, 76, 78 activate the signal paths 87-92, to which they supply their output signal. There is always only precisely one signal path 87-92 active, i.e. exactly one switch 67, 69, 71, 74, 76, 78 is closed.

The first signal path 87 contains only the switch 67. This signal path 87 therefore only processes the unmodified frequency range of the voltage-controlled oscillator 64 from 6 GHz to 12 GHz in this exemplary embodiment. The second signal path 88 contains a frequency splitter 66 which halves the frequencies of present signals, a low-pass filter 68 and the switch 69. The frequency splitter 66 is a frequency-halving splitter and halves the frequency of the voltage-controlled oscillators 64. In addition to a halving of the frequency through the frequency splitter 66, any other division factors required are, however, also conceivable.

The low-pass filter 68 filters high-frequency components above 6 GHz. The second signal path could therefore process frequencies from 3 GHz to 6 GHz. However, in order to use simpler filters, this range is divided using a third signal path 89. This means the second signal path 88 processes signals from 4.5 GHz to 6 GHz. The third signal path processes signals from 3 GHz to 4.5 GHz. The third signal path 89 is structured in a similar manner to the second signal path 88. The filter 70 corresponds to the filter 68. The switch 71 corresponds to the switch 69.

In order to process even lower frequencies, two further, similarly structured signal paths 90, 91 are used. A further frequency splitter 72, which halves the frequencies of incoming signals, is connected upstream of this. This means that, at the output of this frequency splitter 72, signals with ¼ of the frequency of the signals of the voltage-controlled oscillator 64 are present. The fourth signal path 90 contains the low-pass filter 73 and the switch 74. It processes signals from 2 GHz to 3 GHz. The fifth signal path 91 contains the low-pass filter 75 and the switch 76. It processes signals from 1.5 GHz to 2 GHz.

A processing of signals of even lower frequency would necessitate the use of further frequency splitters. This would, however, increase component noise and lead to higher costs. Furthermore, a frequency of 0 Hz cannot be attained by means of a frequency splitter. Accordingly, a single, additional frequency path is introduced for the range of 0 GHz to 1.5 GHz. This signal path 92 does not operate in the same manner as the other signal paths 87-91. Instead, the frequency of the clock signal is multiplied by a frequency multiplier 61. In this exemplary embodiment, the multiplication factor is 8. The resulting signal provides a frequency of 3.072 GHz at a clock frequency of 384 MHz. This signal is mixed down in a mixer 65 with the signal of the voltage-controlled oscillator 64 from the second signal path 88, reduced in its frequency by the division factor. In this example, the resulting signal provides a frequency range of 0 GHz to 3 GHz. To increase the spectral purity, a low-pass filter 77 is used, which filters high-frequency components above 1.5 GHz. The resulting signal is connected through by the switch 78, if required.

As an alternative, a further signal path could be included through direct usage of the signal of the direct digital synthesizer converted into an analog signal.

Accordingly, very small frequencies could be generated with very high precision.

The signal paths 87-92 operate in parallel. This means only the setting of the switches 67, 69, 71, 74, 76, 78 determines which signal is relayed.

The level of the signal is compensated by a level variation device 79. At the output of the level variation device 79, the level of the signal is determined by a level determining device 80, and this is passed to the level variation device 79. A feedback occurs, which causes a controlling of the level. The level is modified by up to +/−5 dB. Greater changes to the level are not necessary, because the signal paths already provide a largely constant level characteristic over the frequency. The signal, adjusted in its level, is output via the signal output 81.

Figure 5:
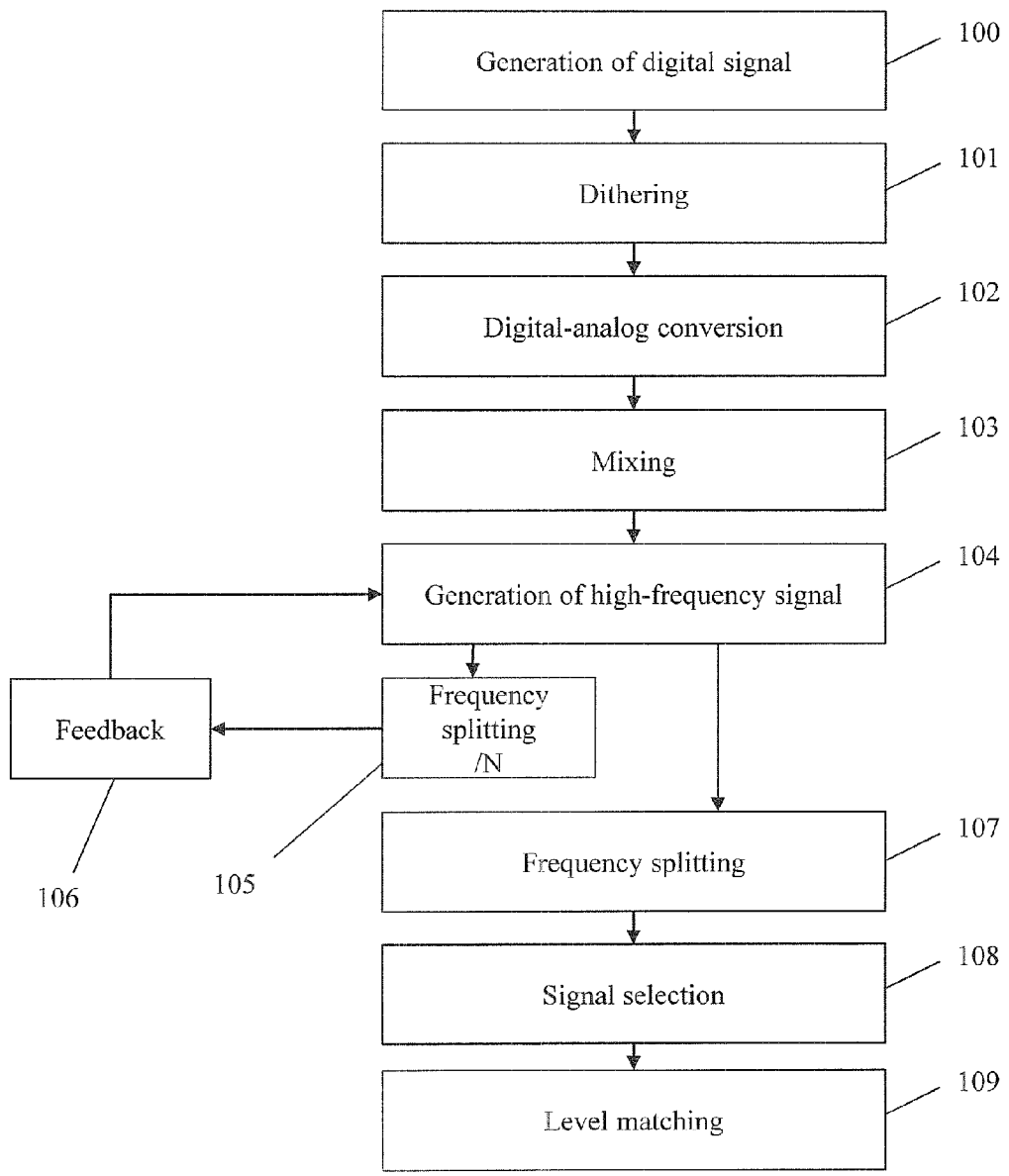
FIG. 5 shows an exemplary embodiment of the method according to the invention.

FIG. 5 shows an exemplary embodiment of the method for operating the measuring device according to the invention. In a first step 100, at least two digital, high-frequency signals are generated. The generation is accurate in frequency and phase, for example, with a high precision of 48 bit. In this exemplary embodiment, the frequency of the generated signal is between 40 MHz and 100 MHz. The generation of the signal occurs here by means of direct digital synthesiz. In a second step 101, a dithering is implemented. This means the digital signals are charged with high-frequency white noise of low amplitude.

In a third step 102, the signals are converted into analog signals. This is implemented with considerably lower precision, for example, 12 bit, than the generation of the signal. On average, however, the correct frequency and correct phase position of the signals are obtained as a result of the dithering.

In a fourth step 103, the analog signals are mixed with a clock signal. They are accordingly transformed into another frequency range. In this exemplary embodiment, the clock frequency is 384 MHz and an upward mixing is implemented. This achieves a frequency range of the resulting signals of 424-484 MHz.

In a fifth step 104, signals of considerably higher frequency are generated from the analog signals. For this purpose, the signals are supplied to a phase discriminator of a PLL (Phase Locked Loop). In this exemplary embodiment, the output frequency of the PLL is between 6 GHz and 12 GHz. In a sixth step 105, the resulting very high-frequency signals are divided by an integer division factor. This can occur in one step or several steps. In a seventh step 106, the divided signals are fed back and are used as control variables for the PLL. A signal of a very stable frequency and phase can be achieved in this manner.

The fifth, sixth and seventh steps 104, 105, 106 are constantly repeated. This achieves a sustained control of the frequency of the resulting signals. In an eighth step 107, a frequency splitting is implemented. Here, the frequencies of the signals are divided in at least one step. A division over several steps is also possible. In this manner, the signals are split into several signal paths of different frequency ranges.

In a ninth step 108, one of the several signals is selected in each case. Only this single signal is supplied respectively for further processing. The signals of the remaining frequency paths 87-92 are not relayed. In a tenth step 109, the selected signals are subjected to a level matching. This ensures that the level of the output signal is independent of its frequency.

The invention is not restricted to the exemplary embodiments presented. As already explained, a greater number of signals output from several direct digital synthesizers can be generated. The use of a different control of the high-frequency is also conceivable. Furthermore, alternative embodiments of the frequency paths of the frequency splitting device are possible. All features described above or features shown in the drawings can be favourably combined as required within the framework of the invention.

The invention claimed is:

1. A measuring device with a synthesizer device, at least two controlling devices and at least two controlled oscillators,
    wherein the synthesizer device contains at least one direct digital synthesizer,
    wherein signals generated by the synthesizer device form reference signals of at least one of the controlling devices,
    wherein the signals formed by the controlling devices control the controlled oscillators directly or indirectly,
    wherein the measuring device contains frequency splitters, which divide by an integer division factor,
    wherein the measuring device contains no fractional frequency splitters,
    wherein the synthesizer device contains precisely one direct digital synthesizer with precisely one phase accumulator with several tappings,
    wherein the synthesizer device generates at least two signals of identical frequency, different phase and known phase ratio,
    wherein the controlling devices each contain a phase discriminator, a loop controller and at least one frequency splitter, which divides by integer division factors,
    wherein the frequency splitters divide the frequency in each case of a signal generated by one of the controlled oscillators, and
    wherein each frequency splitter transmits the signal it has generated to its respective phase discriminator.

2. The measuring device according to claim 1,
    wherein the measuring device contains at least two frequency splitters, and
    wherein each frequency splitting device processes signals generated by a controlled oscillator.

3. The measuring device according to claim 2,
    wherein every frequency splitting device contains several frequency paths for signals of different frequency ranges,
    wherein every frequency path contains a switching device, which connects the frequency path to a signal output, and
    wherein, at the same time, precisely one frequency path is connected by the switching device to the signal output.

4. The measuring device according to claim 3,
    wherein at least one frequency path contains a filter, and that at least one frequency path contains at least one frequency splitter, which divides by integer division factors.

5. The measuring device according to claim 4,
    wherein a mixer is arranged within at least one frequency path, and
    wherein the mixer within the frequency path mixes the signal of the frequency path down with a clock frequency or a multiple of a clock frequency.

6. The measuring device according to claim 3,
    wherein a mixer is arranged within at least one frequency path, and
    wherein the mixer within the frequency path mixes the signal of the frequency path down with a clock frequency or a multiple of a clock frequency.

7. The measuring device according to claim 2,
    wherein at least one mixer is arranged between the synthesizer device and the controlled oscillators, and wherein the mixer mixes at least one signal generated by the synthesizer device with a clock signal or a multiple of a clock signal.

8. The measuring device according to claim 2,
wherein the synthesizer device generates digital signals with high precision,
wherein at least one digital-analog converter is arranged between the synthesizer device and the controlled oscillator,
wherein the digital-analog converter converts a signal generated by the synthesizer device into an analog signal,
wherein the digital-analog converter provides a lower quantization precision than the synthesizer device,
wherein at least one dithering device is connected downstream of the synthesizer device, and
wherein the dithering device implements a dithering of at least one signal generated by the synthesizer device.

9. The measuring device according to claim 1,
wherein at least one mixer is arranged between the synthesizer device and the controlled oscillators, and
wherein the mixer mixes at least one signal generated by the synthesizer device with a clock signal or a multiple of a clock signal.

10. The measuring device according to claim 1,
wherein the synthesizer device generates digital signals with high precision,
wherein at least one digital-analog converter is arranged between the synthesizer device and the controlled oscillator,
wherein the digital-analog converter converts a signal generated by the synthesizer device into an analog signal,
wherein the digital-analog converter provides a lower quantization precision than the synthesizer device,
wherein at least one dithering device is connected downstream of the synthesizer device, and
wherein the dithering device implements a dithering of at least one signal generated by the synthesizer device.

11. A method for the operation of a measuring device with at least one synthesizer device and at least two controlled oscillators,
wherein the synthesizer device contains at least one direct digital synthesizer,
wherein the signals generated by the synthesizer device are used as reference signals of a control of the controlled oscillators,
wherein frequency splitters, which divide by integer division factors, are used,
wherein no fractional frequency splitters are used,
wherein the synthesizer device contains precisely one direct digital synthesizer with precisely one phase accumulator with several tappings,
wherein at least two signals of identical frequency, different phase and known phase ratio are generated by the synthesizer device,
wherein the frequencies of the output signals of the controlled oscillators are divided by integer division factors,
wherein the signals generated by the synthesizer device and the output signals of the controlled oscillators divided in their frequency are subjected to a phase discrimination in order to generate phase discrimination signals,
wherein control signals are generated from the phase discrimination signals, and
wherein the control signals are used as input signals of the controlled oscillators.

12. The method according to claim 11,
wherein signals generated by the controlled oscillators are processed by the frequency splitters.

13. The method according to claim 12,
wherein every frequency splitter contains several frequency paths for signals of different frequency ranges,
wherein every frequency path contains a switching device, and
wherein precisely one frequency path is connected by the switching device to a common signal output.

14. The method according to claim 13,
wherein the signals on at least one frequency path are filtered, and
wherein the frequencies of the signals on at least one frequency path are divided by an integer division factor.

15. The method according to claim 14,
wherein the signals of at least one frequency path are mixed down with a clock frequency or a multiple of a clock frequency.

16. The method according to claim 13,
wherein the signals of at least one frequency path are mixed down with a clock frequency or a multiple of a clock frequency.

17. The method according to claim 12,
wherein the signals generated by the synthesizer device are mixed with a clock signal or a multiple of a clock signal.

18. The method according to claim 12,
wherein digital signals are generated by the synthesizer device with high precision,
wherein the signals generated by the synthesizer device are subjected to a digital-analog conversion,
wherein the digital-analog conversion provides a lower precision than the generation of the signals by the synthesizer device, and
wherein the signals generated by the synthesizer device are subjected to a dithering.

19. The method according to claim 11,
wherein the signals generated by the synthesizer device are mixed with a clock signal or a multiple of a clock signal.

20. The method according to claim 11,
wherein digital signals are generated by the synthesizer device with high precision,
wherein the signals generated by the synthesizer device are subjected to a digital-analog conversion,
wherein the digital-analog conversion provides a lower precision than the generation of the signals by the synthesizer device, and
wherein the signals generated by the synthesizer device are subjected to a dithering.

* * * * *